(12) United States Patent
Byeon (10) Patent No.: US 8,218,371 B2
(45) Date of Patent: Jul. 10, 2012

(54) MULTI-BIT FLASH MEMORY DEVICE AND METHOD OF ANALYZING FLAG CELLS OF THE SAME

(75) Inventor: Dae-Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 357 days.

(21) Appl. No.: 12/467,529

(22) Filed: May 18, 2009

(65) Prior Publication Data

US 2009/0313423 A1  Dec. 17, 2009

(30) Foreign Application Priority Data

Jun. 17, 2008  (KR) .............................. 2008-0056897

(51) Int. Cl.
  *G11C 16/04*  (2006.01)
(52) U.S. Cl. ........... 365/185.3; 365/185.33; 365/185.17; 365/185.12; 365/185.24; 365/185.2

(58) Field of Classification Search ............... 365/185.3, 365/185.33, 185.17, 185.12, 185.24, 185.2
See application file for complete search history.

(56) References Cited

U.S. PATENT DOCUMENTS

| 2007/0002613 | A1 | 1/2007 | Rahman et al. |
| 2008/0089123 | A1* | 4/2008 | Chae et al. ............... 365/185.03 |
| 2008/0155364 | A1 | 6/2008 | Hwang |

FOREIGN PATENT DOCUMENTS

| JP | 10055687 | | 2/1998 |
| KR | 100771883 | B1 | 10/2007 |
| KR | 100782329 | B1 | 11/2007 |

* cited by examiner

*Primary Examiner* — Thong Q Le
(74) *Attorney, Agent, or Firm* — Volentine & Whitt, PLLC (57) ABSTRACT

Disclosed is a multi-bit flash memory device which includes a memory cell array and a control circuit. The memory cell array has multiple memory cells and multiple flag cells. The control circuit determines whether the flag cells are programmed, based on a reference corresponding to a read margin of the flag cells, and controls a program operation of the memory cells in response to the determination.

20 Claims, 7 Drawing Sheets

MULTI-BIT FLASH MEMORY DEVICE AND METHOD OF ANALYZING FLAG CELLS OF THE SAME

CLAIM OF PRIORITY

A claim of priority under 35 U.S.C. §119 is made to Korean Patent Application No. 10-2008-0056897 filed on Jun. 17, 2008, the entire contents of which are hereby incorporated by reference.

SUMMARY

Embodiments of the present invention relate to a semiconductor memory device. More particularly, embodiments of the present invention relate to programming of a multi-bit flash memory device.

Semiconductor memory devices may be classified as volatile semiconductor memory devices and non-volatile semiconductor memory devices.

Volatile semiconductor memory devices perform read and write operations at rapid speeds, but lose stored contents when power is turned off. In contrast non-volatile semiconductor memory devices retain stored contents, even when power is turned off. For this reason, the non-volatile semiconductor memory devices are used to store contents which must be retained regardless of whether power is supplied. Non-volatile semiconductor memory devices include mask read-only memory MROM), programmable read-only memory (PROM), electrically programmable read-only memory (EPROM), electrically erasable programmable read-only memory (EEPROM), and the like.

In general, MROM, PROM, and EPROM are not free to be erased and programmed by a system itself, and are therefore difficult for general users to update. EEPROM, however, is capable of being electrically erased or programmed. Therefore, application of EEPROM has increased for auxiliary memories or system programming requiring continuous updates. Flash EEPROM, in particular, exhibits a higher degree of integration than conventional EEPROM, and thus is advantageous in large auxiliary memory applications, for example. NAND-type flash EEPROM (hereinafter, "NAND-type flash memory") has a higher degree of integration than other types of flash EEPROMs.

High-density memory devices have been developed in which multi-level flash memory devices are capable of storing multi-bit data in a memory cell. Thus, in a flash memory device, data states able to be stored in each memory cell are determined according to the number of bits to be stored in each memory cell. For example, a memory cell storing 1-bit data is called a single-bit cell or a single-level cell (SLC), and a memory cell storing multi-bit data is called a multi-bit cell, a multi-state cell, or a multi-level cell (MLC).

Various embodiments are directed to a multi-level flash memory device and a method of analyzing flag cells of a multi-level flash memory device, e.g., which improve asymmetric read margin characteristics of the flag cells and increase accuracy of multi-bit programmng.

One aspect of the invention is directed to a multi-bit flash memory device that includes a memory cell array and a control circuit. The memory cell array has multiple memory cells and multiple flag cells. The control circuit determines whether the flag cells are programmed, based on a reference corresponding to a read margin of the flag cells, and controls a program operation of the memory cells in response to the determination.

Another aspect of the invention is directed to a method of analyzing flag cells of a multi-bit flash memory device. The method includes analyzing flag information stored in each flag cell of multiple flag cells, and controlling a program operation of multiple memory cells corresponding to the flag cells in response to analyzing the flag information. Analyzing the flag information includes determining whether the flag cells are programmed according to a reference corresponding to a read margin of the flag cells.

BRIEF DESCRIPTION OF THE FIGURES

The attached drawings illustrate non-limiting embodiments of the present invention, where like reference numerals refer to like parts throughout the figures unless otherwise specified.

DETAILED DESCRIPTION OF THE EMBODIMENTS

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements.

A multi-bit flash memory device, according to various illustrative embodiments, is configured to determine whether flag cells are programmed based on a determination reference corresponding to asymmetric read margins of the flag cells. An operation of programming memory cells may be controlled according to the determination result. The determination reference may correspond to read margin characteristics of the flag cells. For this reason, program states (also referred to as data states) of the flag cells may be determined with precision, even though the read margins are asymmetric. Accordingly, it is possible to improve the accuracy of multi-bit program operations.

Figure 1:
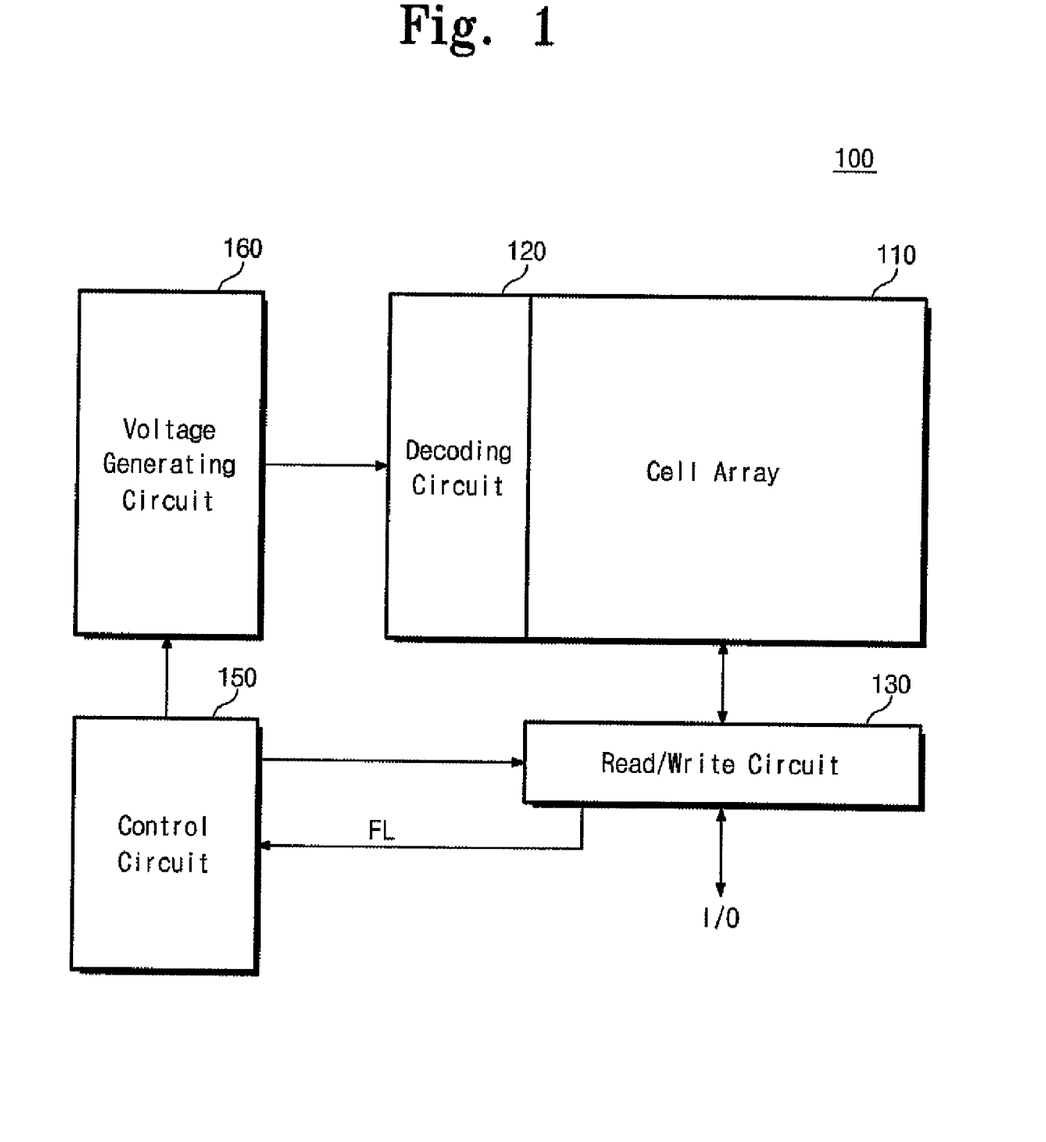
FIG. 1 is a block diagram showing a flash memory device, according to illustrative embodiments.

FIG. 1 is a block diagram of a flash memory device, according to illustrative embodiments.

Referring to FIG. 1, flash memory device 100 includes a memory cell array 110, which has memory cells (not shown) arranged in multiple rows (or word lines) and columns (or bit lines). Each of the memory cells in the memory cell array 110 may store 1-bit data or N-bit data (where N is an integer greater than or equal to 2). Accordingly, the memory cell array 110 may include MLCs, SLCs, or a mixture of MLCs and SLCs. Further, the memory array 110 may be divided into a main region for storing user data and a spare region for storing additional information, related to the main region and the user data. The additional information may include, for example, flag information, ECC, device code, maker code, page information, and the like. Each of the memory cells in the main and spare regions may store 1-bit data or N-bit data.

Figure 2:
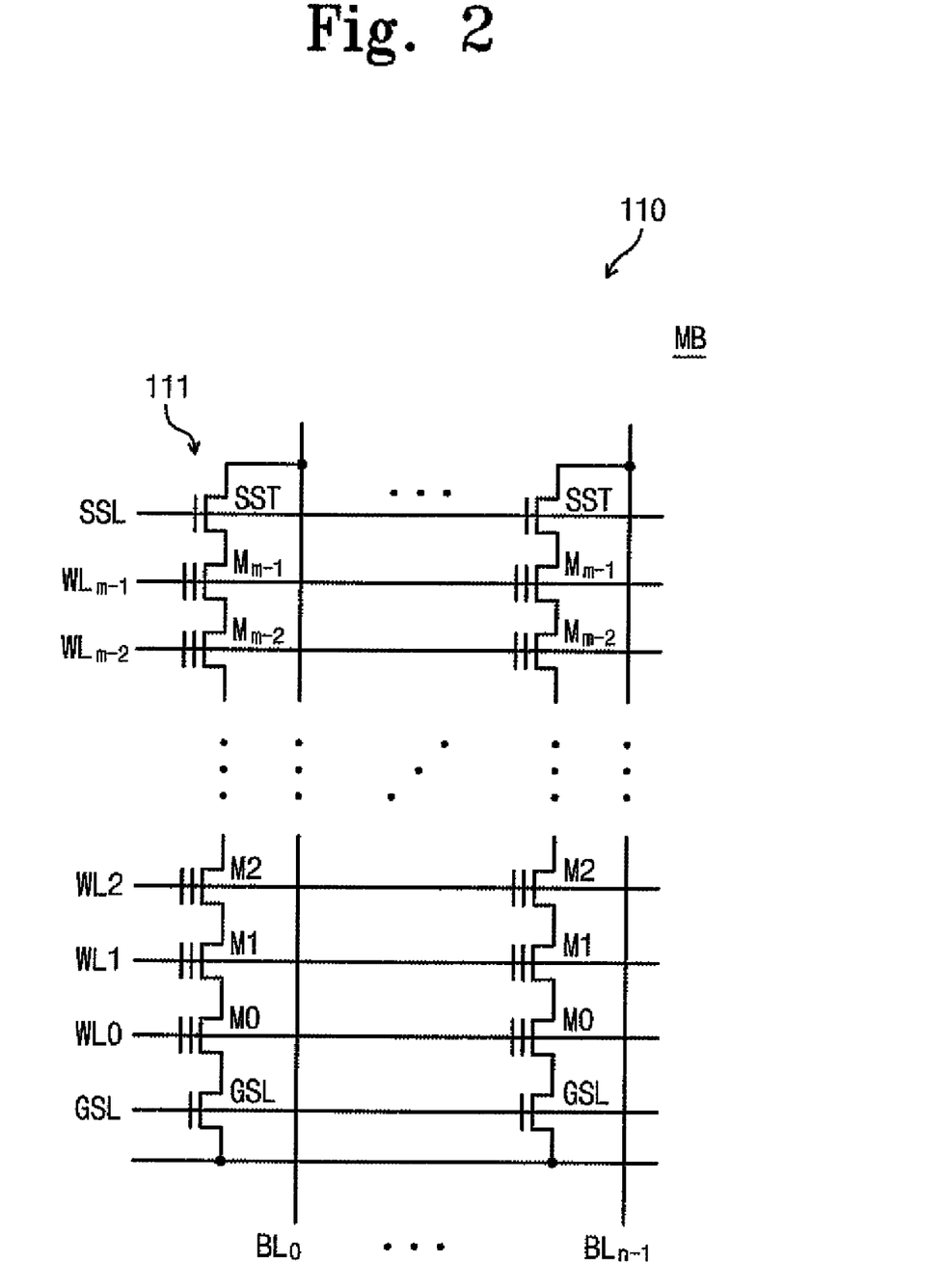
FIG. 2 is a circuit diagram showing a structure of a cell array illustrated in FIG. 1, according to an embodiment.
Figure 3:
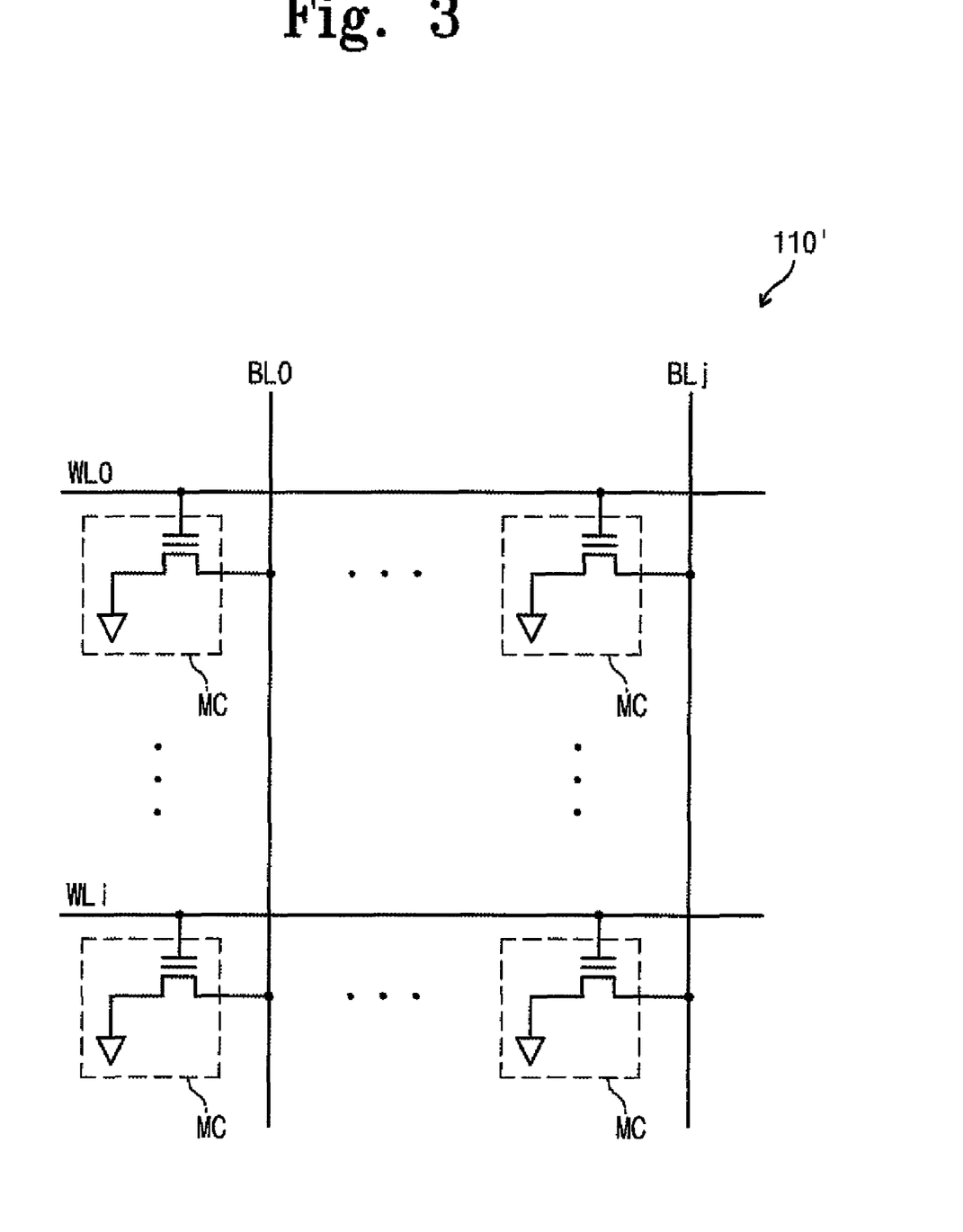
FIG. 3 is a circuit diagram showing a structure of a cell array illustrated in FIG. 1, according to an embodiment.

FIGS. 2 and 3 are circuit diagrams showing examples of structures of the memory cell array illustrated in FIG. 1, according to illustrative embodiments.

Memory cells in memory cell array 110 may constitute multiple memory blocks. Memory cells in each of the memory blocks may be arranged to have a NAND string structure, as illustrated in FIG. 2, or a NOR structure, as illustrated in FIG. 3. The arrangements of memory cells illustrated in FIGS. 2 and 3 may be applied to both the main region and the spare region of the memory array 10.

As will be described below, an operating characteristic of the flash memory device 100, e.g., a method of analyzing results read from flag cells, may be applied to the memory cells illustrated in FIGS. 2 and 3. Flag cell analyzing methods of the illustrative embodiments may be applied not only to a flash memory device using a conductive floating gate as a charge storing layer, but also to a Charge Trap Flash (CTF) using an insulation film as a charge storing layer, for example. Further, the flag cell analyzing methods of the illustrative embodiments may be applied to other types of non-volatile memory devices, such as MROM, PROM, and the like.

Below, structures of a memory cell array will be more fully described with reference to FIGS. 2 and 3.

Referring to FIG. 2, a memory block MB of the memory array 110 includes strings 111, which respectively correspond to columns or bit lines BL0 to BLn-1. Each string 111 includes a string select transistor SST, multiple memory cells M0 to Mm-1, and a ground select transistor GST. In each string 111, a drain of the string select transistor SST is connected to a corresponding bit line, and a source of the ground select transistor GST is connected to a common source line CSL. The memory cells M0 to Mm-1 are connected in series between a source of the string select transistor SST and a drain of the ground select transistor GST. Control gates of memory cells M0 to Mm-1 in each row are connected in common with corresponding word lines WL0 to WLm-1, respectively. The string select transistor SST is controlled by a voltage applied via a string select line SSL, and the ground select transistor GST is controlled by a voltage applied via a ground select line GSL. The memory cells M0 to Mm-1 are controlled by voltages supplied via corresponding word lines WL0 to WLm-1, respectively. Memory cells M0 to Mm-1 connected to each word line WL0 to WLm-1 may store data corresponding to multiple pages or a page.

In a NAND-type flash memory device, program and read operations are conducted by page unit and an erase operation is conducted by block unit, where each block includes multiple pages. Information related to a program operation or an erase operation for each page may be stored in memory cells in a spare region (or, a part of a main region). Such information is called flag information (FL). Memory cells that store the flag information are called flag cells (MF). It is possible to discriminate a program state of a corresponding page (e.g., the program state of a most significant bit (MSB) of a multi-level cell) by analyzing the flag information stored in the flag cells.

In the case of multi-level cells, where N-bit data is stored in a memory cell, a program operation for each bit may be conducted independently up to N times, respectively. Each of the program operations may include multiple program loops. In memory cells connected to the same word line, a program operation for each bit of each multi-level cell may be conducted by page unit. During a program operation, a page address may be allotted continuously or non-continuously. An internally allotted page address may be determined considering a frequency of use of a selected memory cell. Page program execution information for each page (hereinafter "flag information") may be stored independently in a corresponding flag cell MF.

A flag cell MF may be used to determine whether an MSB program operation for memory cells of a corresponding page has been executed. For this, the flag cell ME is programmed when the MSB program operation is conducted with respect to the memory cells of the corresponding page. It is possible to determine whether the MSB program operation has been conducted based on flag information FL read out from the flag cell MF. In various embodiments, one page may include one or more flag cells MF. However, for purposes of explanation, the embodiments will be described assuming that multiple flag cells MF (e.g., twenty flag cells) are allotted to each page.

In various embodiments, flag cells MF may be multi-level cells MLC and/or single-level cells SLC which have the same structure (i.e., a NAND string structure) as illustrated in FIG. 2. The physical positions of the flag cells MF are not limited to a specific region. For example, flag cells MF may be formed within the spare region or the main region of the memory cell array 110. Flag cell type and number may vary to be consistent with the structure of the memory cell array 110.

As described below, in the case of a multi-bit flash memory device with multi-level cells, each flag cell MF may have an asymmetric read margin due to program characteristics. A flag cell analyzing method, according to various embodiments, is capable of improving the asymmetric read margin in order to increase the accuracy of analyzing data states of flag cells MF and the accuracy of a multi-bit program operation. The flag cell analyzing method will be more fully described with reference to FIGS. 4 to 6.

Returning to FIG. 1, the flash memory device 100 further includes a control circuit 150, which controls overall operations related to program, erase, and read operations of the flash memory device 100. Data to be programmed are loaded into a read/write circuit 130 via a buffer (not shown) under the control of the control circuit 150. The control circuit 150 also controls a decoding circuit 120, a voltage generating circuit 160, and the read/write circuit 130 such that, during a program interval, a program voltage Vpgm is supplied to a selected word line, a pass voltage Vpass is supplied to unselected word lines, and a voltage of 0V is applied to a bulk where the memory cells are formed. The program voltage Vpgm may be generated in an incremental step pulse programming (ISPP) manner, for example. The program voltage Vpgm may be increased stepwise by a given increment $\Delta V$ as program loops are repeated. An applying number, a voltage level, and a voltage applied time of the program voltage Vpgm used in each program loop may be changed and modified variously under external control (e.g., by a memory controller (not shown)) or internal control (e.g., a control circuit 150), based on the progress state of programming of each page.

The progress state of programming of each page may become a critical factor to control a program operation of the flash memory device 100. When the flash memory device 100 is a multi-bit flash memory device where multiple bits are stored in each memory cell, whether an MSB program operation of a corresponding page is completed may be recognized by reading out flag information FL stored in flag cells MF. In an embodiment, the read operation for flag cells MF is conducted via the read/write circuit 130, and the flag information FL read out from the flag cells MF is analyzed by the control circuit 150.

As appreciated by one skilled in the art, a flash memory device does not support a function in which data is overwritten in a programmed memory cell. For this reason, an erase operation is conducted before programming data. A data value of "0" or "1" may be programmed in an erased memory cell. The state of an erased memory cell corresponds to the condition in which a data value of 1 is programmed.

When a read result indicates that the flag cell ME is in an erase state (i.e., a state corresponding to data "1"), the control circuit 150 recognizes that an MSB program operation of a selected page is not complete. When the read result indicates that the flag cell MF is in a programmed state (i.e., a state corresponding to data "0"), the control circuit 150 recognizes the MSB program operation of the selected page is complete (hereinafter, referred to as an MSB data state). In various embodiments, one or more flag cells MF may be allotted to a page.

When multiple flag cells MF are allotted to a page, the control circuit 150 analyzes results read from the flag cells MF together to recognize an MSB data state of a selected page. For example, the control circuit 150 analyzes the number of flag cells MF indicating that an MSB program operation has been normally completed and recognizes an MSB data state of a selected page according to the analysis. When analyzing results read from flag cells MF, an optimized result may be deducted considering asymmetric read margin characteristics of the flag cells MF. This will be more fully described below.

In FIG. 1, the voltage generating circuit 160 generates word line voltages (e.g., a program voltage, a read voltage, a pass voltage, etc.) to be supplied to the word lines and a voltage to be supplied to a bulk where memory cells are formed, according to the modes of operation. The voltage generating circuit 160 may operate under the control of the control circuit 150. The decoding circuit 120 selects one of the memory blocks (or sectors) in the memory cell array 110 and one of the word lines in the selected memory block under the control of the control circuit 150. The decoding circuit 120 may supply selected and unselected word lines with word line voltages from the voltage generating circuit 160 in response to the control of the control circuit 150.

The read/write circuit 130 is controlled by the control circuit 150 and operates a sense amplifier or a write driver, according to the modes of operation. For example, in a verify/normal read operation, the read/write circuit 130 operates a sense amplifier for reading out data from the memory cell array 110. In a normal read operation, read data in the read/write circuit 130 may be output externally (e.g., to a memory controller or a host) via a buffer. In a verify read operation, read data in the read/write circuit 130 may be provided to a pass/fail checking circuit (not shown), without being externally output.

In a program operation, the read/write circuit 130 operates as a write driver for driving bit lines according to data to be stored in the memory cell array 110. In the program operation, the read/write circuit 130 receives data to be programmed in the memory cell array 110 via the buffer and drives bit lines according to the received data. For this, the read/write circuit 130 may include page buffers (not shown) corresponding to columns (or bit lines) or column pairs (or bit line pairs). Program and read operations executed by the read/write circuit 130 may be conducted independently with respect to each bit (e.g., LSB data bit and MSB data bit) of a multi-level cell MLC in response to the control of the control circuit 150. A program/read voltage to be used for the program/read operation changes according to execution of the program operation with respect to each bit of a multi-level cell MLC currently being programmed.

Figure 4:
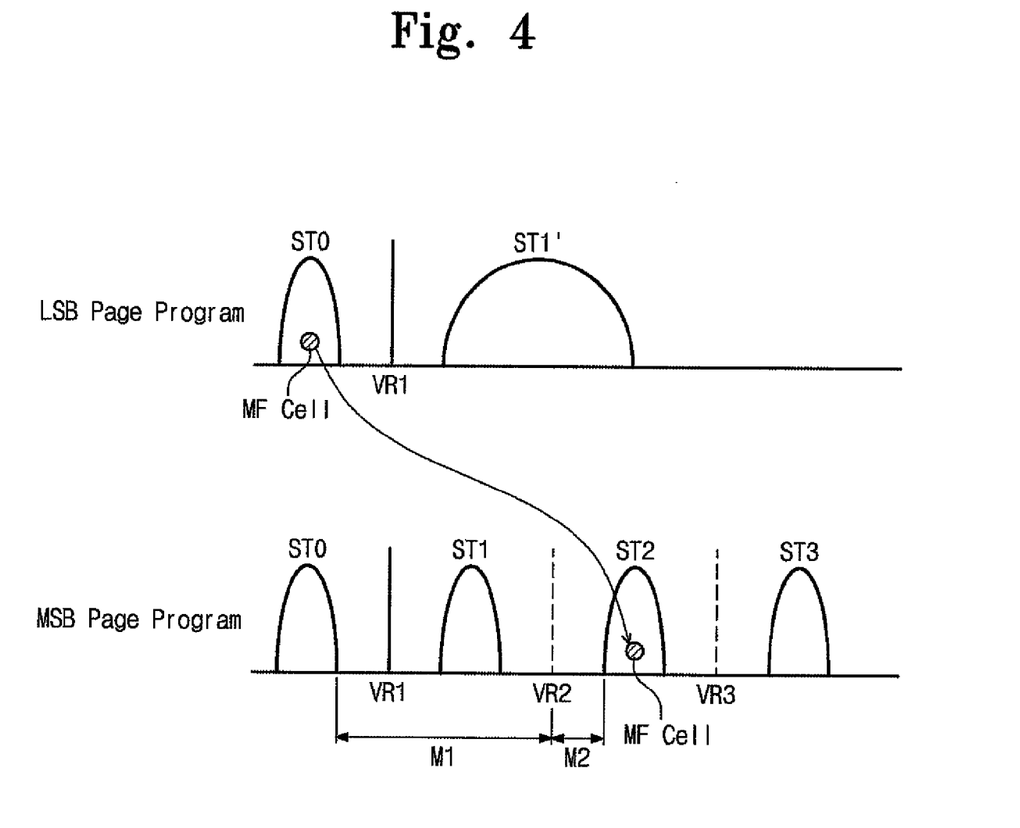
FIG. 4 is a diagram showing program state distributions of flash memory cells illustrated in FIG. 2, according to an embodiment.

FIG. 4 is a diagram showing representative data state distributions of flash memory cells illustrated in FIG. 2, according to an illustrative embodiment. More particularly, FIG. 4 illustrates data state distributions of main memory cells and flag cells consisting of multi-level cells (e.g., 2-bit cells). However, it is understood that FIG. 4 is an example, and that the data state distributions and/or the number bits in the multi-level cells may differ in various embodiments.

Referring to FIG. 4, one memory cell is capable of storing N-bit (e.g., 2-bit) data, and each bit of the N-bit data may be programmed independently via page program operations, which are executed independently. For example, in a 2-bit multi-level cell, the lower bit or least significant bit (LSB) of the two bits of programmed data is programmed via an LSB page program operation, and an upper bit or most significant bit (MSB) is programmed via an MSB page program operation. The MSB page program operation may be performed after the LSB page program operation is executed. Each of the LSB and MSB page program operations may consist of multiple program loops according to an ISPP program scheme, for example.

During the LSB page program operation, the LSB of a memory cell is programmed to a value of "1" or "0" according to the LSB data value loaded into a page buffer. At this time, the MSB is maintained in an erase state. In FIG. 4, data state ST0 indicates when the LSB is programmed to a value of data "1" and data state ST1' indicates when the LSB is programmed to a value of data "0". In various embodiments, the data state ST0 may correspond to data "11" among data states in a 2-bit multi-level cell, and the data state ST1' may correspond to data "10". Whether the value of the LSB is programmed to data "1" or data "0" is recognized via a read operation using first read voltage VR1. While the LSB page program operation is conducted with respect to the selected page, a corresponding flag cell MF is maintained in an erase state (e.g., a ST0 data state).

Upon completion of the LSB page program operation, an MSB page program operation is carried out. During the MSB page program operation, a value of the MSB of a memory cell may be programmed to a value of "1" or "0" according to the value of MSB data loaded into the page buffer. As a result each memory cell may have one of four data states ST0 to ST3. In various embodiments, the STO0 data state corresponds to data "11", the data state ST1 corresponds to data state "10", the data state ST2 corresponds to data state "01", and the data state ST3 corresponds to data "00". However, it would be apparent to one skilled in the art that the relationship between the data states ST0 to ST3 and the data states in FIG. 4 may vary.

FIG. 4 shows a data state transition of one of the flag cells MF allotted to one page. In an illustrative embodiment, there may be twenty flag cells MF, for example, allotted to one page. While an MSB page program operation of the selected page is executed, flag cells ME corresponding to the selected page may be programmed to the data state of ST2 from the data state of ST0. The program state transition of the flag cell illustrated in FIG. 4 is one example. Each flag cell MF is capable of being programmed to any one of states ST0 to ST3.

Whether each flag cell MF is programmed may be recognized via a read operation carried out using the second read voltage VR2. When the flag cell MF is determined to be programmed to the data state ST0, an MLC program operation of the corresponding page is determined to be incomplete. On the other hand, when the flag cell MF is determined to be programmed to the data state ST2, an MLC program operation of the corresponding page is determined to be complete. The control circuit 150 may analyze results read from each flag cell MF together.

As shown in FIG. 4, the data states ST0 and ST2 of a flag cell MF may exhibit asymmetric characteristics on the basis of the second read voltage VR2. That is, margin M1 (hereinafter, the "first margin") between the data state ST0 and the second read voltage VR2 is greater than margin M2 (hereinafter, the "second margin") between the second read voltage VR2 and the data state ST2. With an experimental result the first margin M1 may have a value of about 3V, and the second margin M2 may have a value of about 0.5V, for example. In various embodiments, the control circuit 150 may analyze results read from flag cells together, considering the asymmetric read margin characteristics of the flag cells. The analyzed result is used to determine whether an MSB program operation of the selected page is complete.

Figure 5:
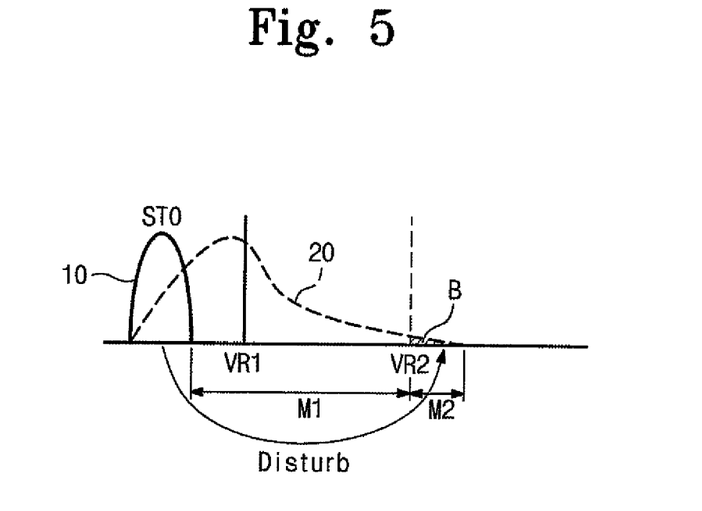
FIGS. 5 and 6 are diagrams showing flag cell analyzing methods considering asymmetric read margins of flag cells, according to an embodiment.
Figure 6:
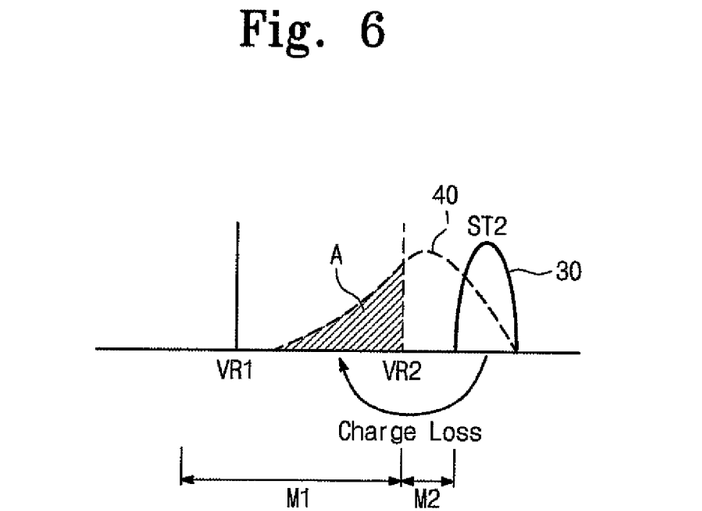

FIGS. 5 and 6 are diagrams for describing flag cell analyzing methods considering asymmetric read margin of flag cells. FIGS. 5 and 6 show a threshold voltage distribution of multiple flag cells, for example, twenty flag cells, after an MSB program operation has been executed. The threshold voltage distribution illustrated in FIGS. 5 and 6 corresponds to a threshold voltage distribution of flag cells allotted to one page.

Referring to FIGS. 5 and 6, flag cells MF allotted to each page may be program failed due to various causes in the program operation. When flag information FL read out from flag cells MF is analyzed, an allowable fail range may be determined considering an asymmetric read margin. Whether an MSB program operation for flag cells MF is complete is determined according to the allowable fail range. As described above, the asymmetric read margin of flag cells MF may be closely related to the allowable fail range, which may become a factor in finally determining whether an MSB program operation of flag cells is complete. Fail types caused at flag cells MF in a program operation and allowable fail ranges of respective fail types are as follows.

Referring to FIG. 5, during an MLC program operation, flag cells MF having the data state ST0 suffer program disturbance from adjacent memory cells, such that the threshold voltage distribution of each may change from curve 10 to curve 20, for example. The program disturbance phenomenon causes flag cells MF having the data state ST0 to be programmed. As a result, the threshold voltage may increase above the second read voltage VR2 used for reading the flag cells MF. For example, flag cells MF having a threshold voltage distribution in region B may be read to have the data state ST2, resulting in occurrence of a read error. In illustrative embodiments, an allowable range of read errors of flag cells MF due to program disturbance is set within a given number (e.g., seven). The allowable read error range (i.e., the number of failed flag cells) is associated with the asymmetric read margin of the flag cells MF.

When twenty flag cells MF are allotted to one page, for example, region B may include a maximum of seven flag cells MF. That is, the control circuit 150 allows for failure of seven or fewer flag cells MF due to program disturbance. In this case, the number of flag cells MF read out as the data state ST0 may be thirteen or more. The number of flag cells MF read out as the data state ST0 or the number of flag cells MF in region B may be used as a reference for determining data states of all flag cells MF corresponding to a programmed page.

For example, where seven or fewer flag cells MF of the twenty flag cells MF are read out to have the data state ST2, the control circuit 150 determines that flag cells MF corresponding to a programmed page have the data state ST0. The control circuit 150 thus recognizes that an MLC program operation of a corresponding page has not been carried out, based on the determination result of the flag cells MF. On the other hand, when more than seven flag cells MF are read out to have the data state ST2, the control circuit 150 determines that the flag cells MF corresponding to a programmed page have the data state ST2, and that an MLC program operation of the corresponding page has been carried out. In this case, the control circuit 150 recognizes that flag cells MF, read out to have data state ST2, are to be normally programmed. The control circuit 150 may recognize that flag cells ME, read out to have the data state ST0, are to be program failed. At this time, the number of flag cells MF read out to have the data state ST0 may be less than twelve.

Referring to FIG. 6, a threshold voltage distribution of flag cells MF having data state ST2 may change from curve 30 to curve 40 due to charge loss caused at an MLC program operation. The charge loss phenomenon may cause charge to leak from flag cells MF having data state ST2, such that the threshold voltage used for reading flag cells MF drops below the second read voltage VR2. For example, an error is generated when a flag cell MF having a threshold voltage distribution in region A is read out as having data state ST0. In the various embodiments, an allowable range of read errors of flag cells MF due to charge loss is set within a given number (e.g., twelve). The allowable read error range (i.e., the number of failed flag cells) may be associated with the asymmetric read margin of the flag cells MF.

When twenty flag cells MF are allotted to one page, a maximum of twelve flag cells MF are allowed to be included in region A. That is, the control circuit 150 allows twelve or fewer flag cells MF to fail due to charge loss. In this case, the number of flag cells MF read to have data states ST2 may be eight or more. The number of flag cells MF read out as having data state ST2 or the number of flag cells MF included in region A may be used as a reference used to determine data states of all flag cells MF corresponding to a programmed page.

For example, when fewer than twelve flag cells MF of the twenty flag cells MF are read out to have data state ST0, the control circuit 150 determines that flag cells MF of a programmed page have data state ST2. The control circuit 150 may recognize an MLC program operation of a corresponding page to be carried out based on the determination result of the flag cells MF. On the other hand, when more than twelve flag cells MF are read out to have data state ST0, the control circuit 150 determines that flag cells MF of a programmed page have data state ST0. That is, the MLC program operation of a corresponding page may be determined to be carried out. In this case, the control circuit 150 may recognize flag cells MF, read out to have the data state ST0, to be programmed normally and flag cells MF, read out to have the data state ST2, to be program failed. At this time, the number of flag cells MF read out to have data state ST2 may be less than seven.

As described above, data states of flag cells MF may be determined according to either the number of flag cells MF belonging to region A or region B obtained by a read result of flag cells MF or the number of flag cells MF programmed to have data state ST0 or ST2. In particular, a reference for determining all data states of flag cells MF may have an asymmetric characteristic like the read margin of flag cells MF illustrated in FIG. 4.

Referring to the representative flag cell MF illustrated in FIG. 4, the first margin M1 corresponding to data state ST0 is larger than the second margin M2 corresponding to state ST2. Accordingly, the number of failed flag cells MF generated within the first margin M1 may be set to be more than the number of failed flag cells MF generated within the second margin M2. For example, it is assumed that the allowable number of failed flag cells MF generated within the first margin M1 is "a" (refer to region A in FIG. 6) and that the allowable number of failed flag cells generated within the second margin M2 is "b" (refer to region B in FIG. 5), where "a" and "b" are integers. When the first margin M1 is larger than the second margin M2, the allowable number "a" is larger than the allowable number "b". As illustrated in FIGS. 5 and 6, the allowable fail number within the first margin M1 may be set to twelve (i.e., a=12), and the allowable fail number within the second margin M2 may set to seven (i.e., b=7). That is, the allowable fail number of flag cells MF within a wide read margin may be set to be relatively large, and the allowable fail number of flag cells within a narrow read margin may be set to be relatively small. As set forth above, the allowable fail number of flag cells may be defined so as to be proportional to the magnitude of the read margin of flag cells MF. The allowable fail number of flag cells MF thus defined may be used as a determination reference for determining whether flag cells MF are programmed.

The allowable fail range of flag cells MF illustrated in FIGS. 5 and 6 (e.g., region A or region B) is not limited to a specific size. For example, the allowable fail number of flag cells MF within the second margin M2 is not limited to seven, and may change in various implementations. Likewise, the allowable fail number of flag cells MF within the first margin M1 is not limited to twelve, and may change in various implementations. Further, assuming that the allowable fail number of flag cells MF within the second margin M2 is "a" and the allowable fail number of flag cells MF within the first margin M1 is "b", the number N of flag cells MF allotted to one page may be larger than the sum of the allowable fail numbers (a+b).

Figure 7:
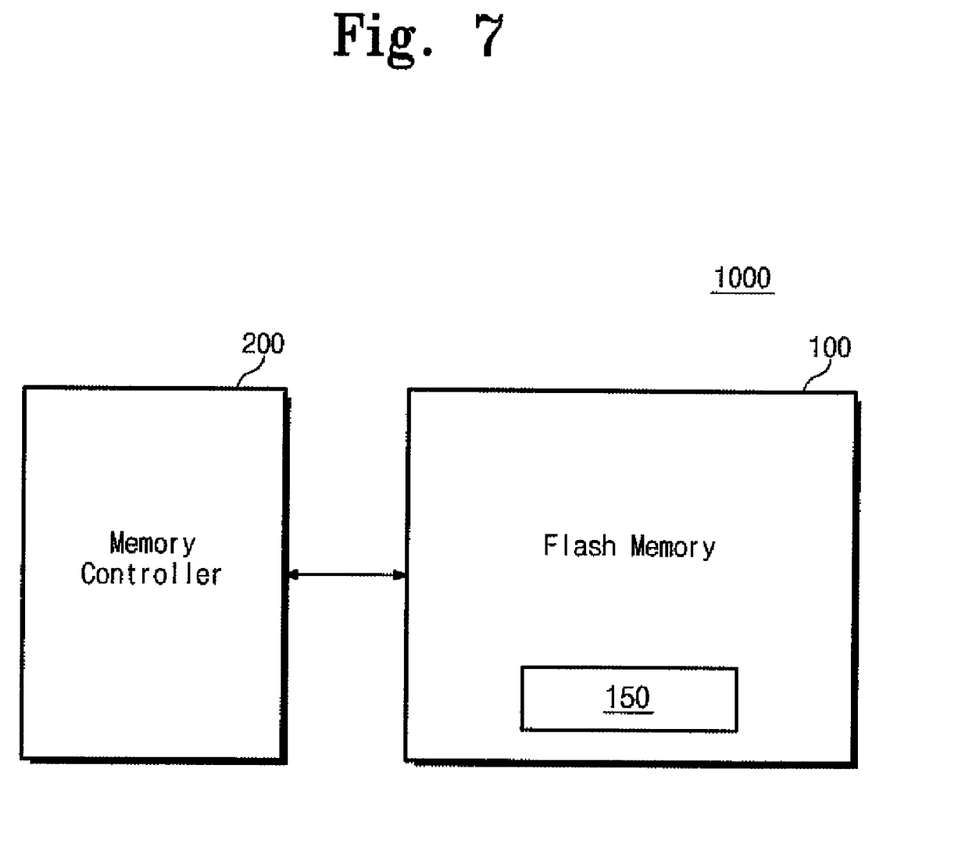
FIG. 7 is a block diagram showing a memory system including a flash memory device, according to illustrative embodiments.

FIG. 7 is a block diagram showing a memory system including a flash memory device, according to illustrative embodiments.

Referring to FIG. 7, a memory system 1000 may include a flash memory device 100 and a memory controller 200. The flash memory device 100 is configured substantially the same as the flash memory device 100 illustrated in FIG. 1, and thus the description will not be repeated. The memory controller 200 may be configured to control the flash memory device 100. The flash memory device 100 may confirm MLC programming of a multi-level memory device according to methods of analyzing flag cells discussed herein, and control program operations of the multi-level memory device according to the confirmed result. Whether the multi-level memory device has been MLC programmed may be determined according to whether flag cells allotted to each page are programmed. In case of the illustrative embodiments, multiple flag cells MF are allotted to one page in order to increase the accuracy of determining the MLC programming.

According to methods of analyzing flag cells, a reference (e.g., the allowable fail number of multiple flag cells) for determining final programming of multiple flag cells MF may be applied asymmetrically. For example, asymmetric read margins M1 and M2 may be considered, as discussed above. That is, the allowable fail number is set relatively high to a wide read margin (e.g., M1), and the allowable fail number is set relatively low to a narrow read margin (e.g., M2). As a result, the allowable fail range set for each margin M1 and M2 may be used to count the exact number of flag cells that are programmed normally and/or are not programmed. The counted result may be used to determine overall whether flag cells allotted to a selected page are programmed. As a result, according to the illustrative embodiments of the flag cell analyzing methods, asymmetric characteristics of the read margins M1 and M2 of flag cells MF may be reflected effectively to determine whether multiple flag cells MF are programmed. With the determination result, it is possible to determine whether an MSB program operation of a selected page has been carried out and to control a program operation with respect to the flash memory device 100.

The memory system 1000 illustrated in FIG. 7 may be a memory card or a memory card system, for example. In this case, the memory controller 200 may be configured to communicate with an external device (e.g., a host) via one of various protocols, such as Universal Serial Bus (USB), Multimedia Card (MMC), PCI-E, Advanced Technology Attachment (ATA), Serial-ATA, Parallel-ATA, Small Computer System Interface (SCSI), Enhanced Small Device Interface (ESDI), and Integrated Drive Electronics (IDE). As is well known in the art, flash memory devices are non-volatile memory devices capable of retaining stored data even when powered-off. Accordingly, flash memory devices are widely used for code storage. Further, flash memory devices according to the various illustrative embodiments may be included in mobile devices, such as cellular phones, personal digital assistants (PDA), digital cameras, portable game consol, and MP3P, as well as in home applications, such as high-definition television (HDTV), DVD, routers, and Global Positioning System (GPS).

Figure 8:
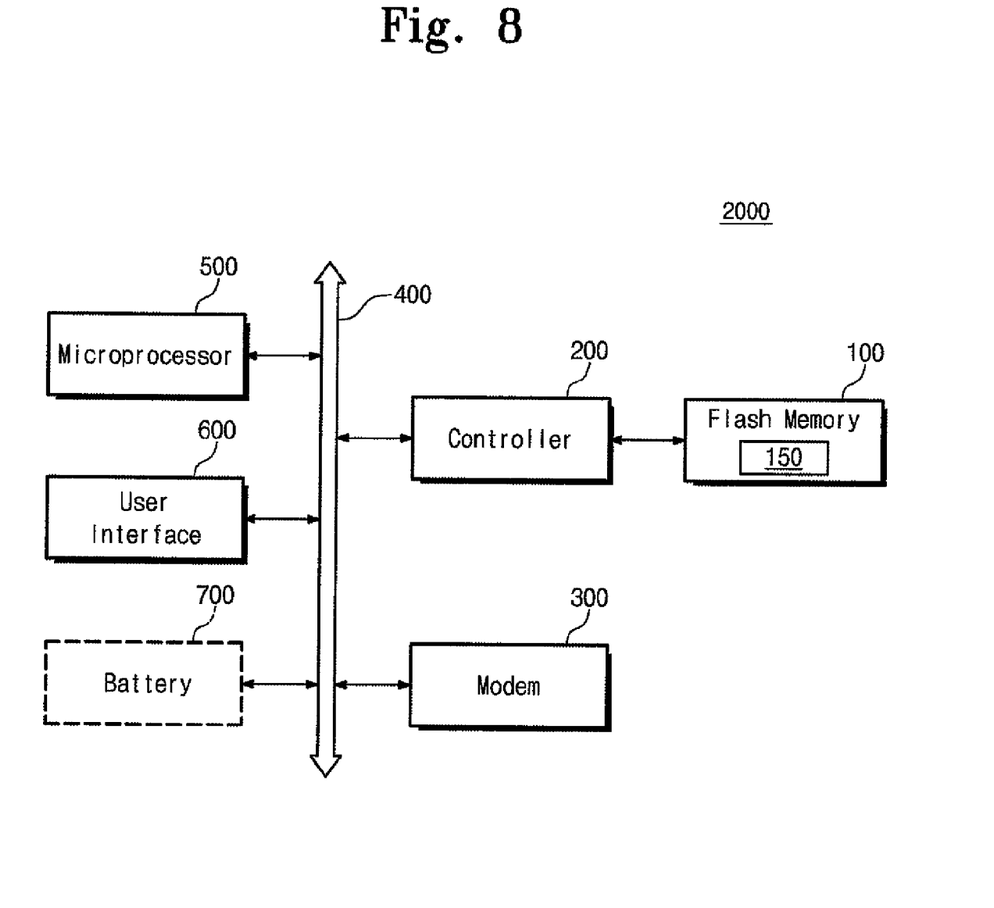
FIG. 8 is a block diagram showing a computing system including a flash memory device, according to illustrative embodiments.

FIG. 8 is a block diagram showing a computing system including a flash memory device, according to illustrative embodiments.

Referring to FIG. 8, a computing system 2000 includes flash memory device 100, a memory controller 200, a modem 300 (such as a baseband chipset), a microprocessor 500 and a user interface 600, all of which are electrically connected to a bus 400. The flash memory device 100 illustrated in FIG. 8 is substantially the same as that illustrated in FIG. 1. N-bit data (where N is an integer greater than or equal to one) processed/to be processed by the microprocessor 500 may be stored in the flash memory device 100 via the memory controller 200.

In the event that the flash memory device 100 is a multi-bit flash memory device capable of storing N-bit data per cell whether an MSB program operation of a selected page is carried out is determined according to the above-described flag cell analyzing method. A program operation of each bit of a selected memory cell may be controlled according to the determined result. Program and read voltages to be used for program and read operations may be selected under the control of a control circuit 150 in the flash memory device 100 or the memory controller 200. The program and read voltages to be used for the program and read operations may be determined by the memory controller 200 or the control circuit 150 in the flash memory device 100 considering the programming of each bit to be performed at a selected memory cell.

When the computing system 2000 is a mobile device, for example, the computing system 2000 may further include a battery for supplying operating voltages. Although not illustrated in figures, it would be apparent to one skilled in the art that the computing system 2000 according to illustrative embodiments may further include an application chipset, a Camera Image Processor (CIS), mobile DRAM, and the like.

Also, the memory controller 200 and the flash memory device 100, for example, may constitute a Solid State Drive/Disk (SSD) that uses non-volatile memory to store data.

A flash memory device and/or a memory controller according to the illustrative embodiments may be packed using various types of packages. For example, the flash memory device and/or the memory controller may be packed using various packages, such as PoP (Package on Package), Ball grid arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and the like.

In various embodiments, memory cells may be formed using one of various cell structures, each having a charge storing layer. It would be apparent to one skilled in the art that a cell structure with a charge storing layer may be a charge trap flash structure, a stack flash structure in which arrays are stacked in multi layers, a source-drain free flash structure, or a pin-type flash structure, for example.

As set forth above, it is possible to precisely perform a read operation for flag cells, even though flag cells of a multi-bit flash memory device have asymmetric read margins. As a result, the read margins of flag cells in the multi-bit flash memory device are improved, and the accuracy of a multi-bit program operation is improved.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A multi-bit flash memory device comprising:
a memory cell array having a plurality of multi-bit memory cells connected to a same word line for storing pages of data, and a plurality of flag cells connected to the word line and allocated to the pages of data, the pages of data including a most significant bit (MSB) page of data; and
a control circuit for determining a number of the flag cells connected to the same word line that are programmed, based on a reference corresponding to a read margin of the flag cells, and for determining whether MSB page of data is complete based on whether the determined number of flag cells exceeds a threshold value, the threshold value being less than the number of flag cells.

2. The multi-bit flash memory device of claim 1, wherein each of the flag cells is programmed to have a first data state or a second data state.

3. The multi-bit flash memory device of claim 2, wherein each of the flag cells has a first margin between the first data state and a read voltage and a second margin between the second data state and the read voltage, the first margin being different from the second margin.

4. A multi-bit flash memory device comprising:
a memory cell array having a plurality of memory cells and a plurality of flag cells; and
a control circuit for determining whether the flag cells are programmed, based on a reference corresponding to a read margin of the flag cells, and for controlling a program operation of the memory cells in response to the determination,
wherein each of the flag cells is programmed to have a first data state or a second data state,
wherein each of the flag cells has a first margin between the first data state and a read voltage and a second margin between the second data state and the read voltage, the first margin being different from the second margin, and
wherein the control circuit allows a program fail number of "a" with respect to the first margin and a program fail number of "b" with respect to the second margin, each of a and b being an integer.

5. The multi-bit flash memory device of claim 4, wherein the plurality of memory cells are programmed by a page unit and at least one flag cell of the plurality of flag cells are allotted to each page.

6. The multi-bit flash memory device of claim 5, wherein the flag cells are programmed when at least one upper bit is programmed in the memory cells of a corresponding page.

7. The multi-bit flash memory device of claim 4, wherein the read margin of the flag cells has an asymmetric magnitude based on a read voltage.

8. The multi-bit flash memory device of claim 4, wherein when a program fail number generated within the second margin is below the program fail number b, the control circuit determines that the flag cells are programmed to the first data state.

9. The multi-bit flash memory device of claim 4, wherein when a program fail number generated within the first margin is below the program fail number a, the control circuit determines that the flag cells are programmed to the second data state.

10. The multi-bit flash memory device of claim 4, wherein the program fail number a is greater than the program fail number b when the first margin is greater than the second margin.

11. The multi-bit flash memory device of claim 4, wherein the number of flag cells allotted to one page is N, N being an integer, and N>(a+b).

12. A memory system comprising:
the multi-bit flash memory device of claim 4; and
a memory controller for controlling the multi-bit flash memory device.

13. A computing system comprising:
a host;
the multi-bit flash memory device of claim 4; and
a memory controller for controlling the multi-bit flash memory device.

14. A method of analyzing flag cells of a multi-bit flash memory device, the method comprising:
analyzing flag information stored in each flag cell of a plurality of flag cells connected to a same word line; and
controlling a program operation of a plurality of memory cells connected to the same word line in response to analyzing the flag information,
wherein analyzing the flag information comprises determining whether a number of the flag cells that are programmed according to a reference corresponding to a read margin of the flag cells exceed a threshold value, the threshold value being less than the number of flag cells.

15. The method of claim 14, wherein each of the flag cells is programmed to have one of a first data state and a second data state.

16. The method of claim 15, wherein each of the flag cells has a first margin between the first data state and a read voltage, and a second margin between the second data state and the read voltage, the first margin being different in size from the second margin.

17. A method of analyzing flag cells of a multi-bit flash memory device, the method comprising:
  analyzing flag information stored in each flag cell of a plurality of flag cells; and
  controlling a program operation of a plurality of memory cells corresponding to the plurality of flag cells in response to analyzing the flag information,
  wherein analyzing the flag information comprises determining whether the flag cells are programmed according to a reference corresponding to a read margin of the flag cells,
  wherein each of the flag cells is programmed to have one of a first data state and a second data state,
  wherein each of the flag cells has a first margin between the first data state and a read voltage, and a second margin between the second data state and the read voltage, the first margin being different in size from the second margin, and
  wherein, when the first margin is larger than the second margin, a program fail number of "a" is allowed with respect to the first margin, and a program fail number of "b" is allowed with respect to the second margin.

18. A method of analyzing flag cells of a multi-bit flash memory device, the method comprising:
  analyzing flag information stored in each flag cell of a plurality of flag cells; and
  controlling a program operation of a plurality of memory cells corresponding to the plurality of flag cells in response to analyzing the flag information,
  wherein analyzing the flag information comprises determining whether the flag cells are programmed according to a reference corresponding to a read margin of the flag cells,
  wherein each of the flag cells is programmed to have one of a first data state and a second data state,
  wherein each of the flag cells has a first margin between the first data state and a read voltage, and a second margin between the second data state and the read voltage, the first margin being different in size from the second margin, and
  wherein the number of flag cells allotted to one page is N, a program fail number of "a" is allowed with respect to the first margin, and a program fail number of "b" is allowed with respect to the second margin, where $N > (a+b)$, and a, b and N are integers.

19. The flag cell analyzing method of claim 18, wherein, when a program fail number generated within the second margin is less than the program fail number b, the flag cells are determined to be programmed to the first data state.

20. The flag cell analyzing method of claim 18, wherein, when a program fail number generated within the first margin is less than the program fail number a, the flag cells are determined to be programmed to the second data state.

* * * * *